(12) United States Patent
Otake

(10) Patent No.: US 7,990,026 B2
(45) Date of Patent: Aug. 2, 2011

(54) SURFACE-MOUNT TYPE CRYSTAL UNIT

(75) Inventor: Hiromi Otake, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 188 days.

(21) Appl. No.: 12/523,313

(22) PCT Filed: Jan. 17, 2008

(86) PCT No.: PCT/JP2008/050521
§ 371 (c)(1),
(2), (4) Date: Jul. 15, 2009

(87) PCT Pub. No.: WO2008/088012
PCT Pub. Date: Jul. 24, 2008

(65) Prior Publication Data
US 2010/0066210 A1     Mar. 18, 2010

(30) Foreign Application Priority Data

Jan. 17, 2007  (JP) ................................. 2007-008257

(51) Int. Cl.
*H01L 41/053* (2006.01)

(52) U.S. Cl. ........................................ 310/344; 310/348

(58) Field of Classification Search .................. 310/340, 310/344, 348
See application file for complete search history.

(56) References Cited

U.S. PATENT DOCUMENTS

| | | | | |
|---|---|---|---|---|
| 6,998,962 B2* | 2/2006 | Cope et al. | ..................... | 370/351 |
| 7,602,107 B2* | 10/2009 | Moriya et al. | ................. | 310/348 |
| 2005/0184625 A1* | 8/2005 | Miyazaki | ..................... | 310/348 |
| 2007/0120614 A1* | 5/2007 | Moriya et al. | ................. | 331/158 |

FOREIGN PATENT DOCUMENTS

| | | |
|---|---|---|
| JP | 11-265957 A | 9/1999 |
| JP | 2003-283293 A | 10/2003 |
| JP | 2004-64701 A | 2/2004 |
| JP | 2004-146956 A | 5/2004 |
| JP | 2005-198197 A | 7/2005 |
| JP | 2006-12936 A | 1/2006 |
| JP | 2006-59958 A | 3/2006 |

* cited by examiner

*Primary Examiner* — Thomas M Dougherty
(74) *Attorney, Agent, or Firm* — Knobbe, Martens, Olson & Bear, LLP

(57) ABSTRACT

In a crystal unit, a crystal blank is accommodated in a container body composed of a bottom wall layer and a frame wall layer, and a metal cover is bonded to the container body by a eutectic alloy. The crystal blank is held by a pair of crystal connecting terminals formed at a position to be an inner bottom surface of a container body on one end portion side of the container body. A grounding external terminal is arranged at one corner of the outer bottom surface of the container body at the other end portion side of the container body. To connect the metal cover to the grounding external terminal, a first conduction metal film electrically connected to the metal cover through an end face metal film on an inner side surface of the frame wall layer is formed on a lower surface of the frame wall layer, and a second conduction metal film electrically connected to the grounding external terminal through an end face metal film on a container body outer side surface is formed on an upper surface of the bottom wall layer, corresponding to the positions where the grounding external terminals are formed.

8 Claims, 5 Drawing Sheets

SURFACE-MOUNT TYPE CRYSTAL UNIT

This application is the U.S. National phase under 35 U.S.C. §371 of International Application PCT/JP2008/050521, filed Jan. 17, 2008, which claims priority to Japanese Patent Application No. 2007-008257, filed Jan. 17, 2007. The International Application was published under PCT Article 21(2) in a language other than English.

TECHNICAL FIELD

The present invention relates to a surface-mount type crystal unit having a grounded metal cover, and more particularly, to a surface-mount type crystal unit having good impact-resistance.

BACKGROUND ART

Since a surface-mount type quartz crystal unit having a quartz crystal blank hermetically encapsulated in a container for surface mounting is small and light, it is incorporated, as a frequency control element, in an oscillation circuit of a variety of portable electronic devices, for example. In the surface-mount type crystal unit, a metal cover is generally used so as to hermetically seal the container. It is desired to electrically ground the metal cover to suppress EMI (electromagnetic interference). In recent years, miniaturization of the surface-mount type crystal unit progresses, and, for example, a planar projection size thereof becomes 2.0 mm×1.6 mm or less.

FIG. 1A is a sectional view showing an example of a conventional surface-mount type crystal unit, FIG. 1B is a plan view showing a state of the conventional crystal unit in which a metal cover is removed, FIG. 1C is a bottom view showing an outer bottom surface of the conventional crystal unit, FIG. 2A is a plan view showing an opening end face (i.e., upper surface) of a frame wall layer in the conventional crystal unit, FIG. 2B is a bottom view showing a stack surface (i.e., lower surface) of the frame wall layer with a bottom wall layer in the conventional crystal unit, and FIG. 2C is a plan view showing a stack surface of the bottom wall layer with the frame wall layer in the conventional crystal unit.

The shown surface-mount type crystal unit uses container body 1 having a recess at one principal surface and having an approximately rectangular parallelepiped shape. Crystal blank 2 is received in the recess that is then covered by metal cover 3. Thereby, crystal blank 2 is hermetically sealed in container body 1. Container body 1 is made of laminated ceramics comprising: bottom wall layer 1a having an approximately rectangular shape; and frame wall layer 1b stacked on bottom wall layer 1a and having a rectangular opening at a center thereof. Container body 1 has the recess that is formed by the opening of frame wall layer 1b. Hence, an inner bottom surface of the recess of container body 1 is an exposed portion of the upper surface of bottom wall layer 1a. The inner bottom surface of the recess is provided with a pair of crystal holding terminals 4 that are near both ends of one short side of the inner bottom surface, respectively. In other words, crystal holding terminals 4 are arranged on one end portion side of container body 1. On the outer bottom surface of container body 1, i.e., the bottom surface of frame wall layer 1a, a pair of diagonal corners, i.e., both ends of one diagonal line are provided with external terminals 5a, 5d for crystal blank 2 and the other corners are provided with grounding external terminals 5c, 5b. These external terminals 5a to 5d are used to surface-mount the crystal unit on a wiring board.

External terminals 5a, 5d are electrically connected to crystal holding terminals 4 via end face metal films 6c formed on an outer side surface of container body 1 and electrically conducting path 6a provided on the stack surface between bottom wall layer 1a and frame wall layer 1b. One end of electrically conducting path 6a is integrally formed with crystal holding terminal 4 on the upper surface of bottom wall layer 1a, as shown in FIG. 2C. The other end of electrically conducting path 6a is extended to the position of the outer side surface of container body 1 and connected to end face metal film 6c.

The opening end surface of container body 1, i.e., an entire surface of a surface surrounding the recess, which is the upper surface of frame wall layer 1b, is formed with sealing metal film 7a, as shown in FIGS. 1B and 2A. In addition, as shown in FIG. 2B, on a lower surface of frame wall layer 1b, i.e., stack surface with bottom wall layer 1a, first conduction metal films 7b are provided near centers of the respective short sides of frame wall layer 1b. First conduction metal films 7b are connected to sealing metal film 7a through end face metal films 7c formed on inner side surfaces of frame wall layer 1b. As shown in FIG. 2C, on an upper surface of bottom wall layer 1a, i.e., stack surface with frame wall layer 1b, second conduction metal films 6b are provided such that films 6b are extended from the centers of the respective short sides to the corners corresponding to positions of external terminals 5c, 5b along the relevant short sides. Second conduction metal films 6b are electrically connected to grounding external terminals 5c, 5b through end face metal films 6c provided on the outer side surfaces of container body 1. By stacking bottom wall layer 1a and frame wall layer 1b, first and second conduction metal films 7b, 6b are electrically connected to each other at the centers of the respective short sides. Thereby, sealing metal film 7a is electrically connected to grounding external terminals 5c, 5b.

When manufacturing the container body by stacking and firing ceramic sheets, first and second conduction metal films 7b, 6b are integrally formed, together with crystal holding terminals 4 and electrically conducting path 6a, with container body 1 by forming tungsten (W) films with printing method and the like for the ceramic sheets corresponding to frame wall layer 1b and bottom wall layer 1a before the stacking and firing, and then stacking and firing the ceramic sheets.

Crystal blank 2 consists of, for example, an AT-cut quartz crystal blank having an approximately rectangular shape. The both principal surfaces of crystal blank 2 are formed with excitation electrodes 8, respectively. From the pair of excitation electrodes 8, extraction electrodes 9 are extended toward both sides of one end of crystal blank 2. Extraction electrodes 9 at the ends of crystal blank 2 are folded between both principal surfaces of crystal blank 2. By adhering extraction electrodes 9 to crystal holding terminals 4 with conductive adhesive 10 and the like at positions at which the pair of extraction electrodes 9 are extracted, crystal blank 2 is fixed and held in the recess of container body 1 and electrically connected to external terminals 5a, 5d.

Metal cover 3 for encapsulating crystal blank 2 in container body 1 is provided with a layer of eutectic alloy 11 along at least an entire circumference of a peripheral portion of one principal surface of the metal cover. The layer of eutectic alloy 11 is formed by, for example, melting and applying the alloy to metal cover 3. Eutectic alloy is gold-tin (Au—Sn) alloy, for example. By contacting the peripheral portion of one principal surface of the metal cover to the upper surface of the opening end surface of container body 1, i.e., the upper surface of frame wall layer 1b, and melting eutectic alloy 11 again, metal cover 3 is bonded to container body 1 and the opening end surface is sealed to hermetically close the recess.

In such a crystal unit, when eutectic alloy 11 is heated to melt upon sealing metal cover 3, molten eutectic alloy 11 is concentrated on the four corners having a relatively large area. Hence, when the connection positions of first and second conduction metal films 7b, 6b are the corners of frame wall layer 1b, there are provided the end face metal films that are used for connection with sealing metal film 7a at the positions of the corners. However, in this case, there is some possibility that the molten eutectic alloy is transferred through the end face metal films and flowing down along an inner wall of the recess, and then reaches crystal holding terminals 4. When the eutectic alloy flows to crystal holding terminals 4, crystal holding terminals 4 are electrically shorted to a ground potential and thus the crystal unit does not function. In addition, when a large amount of the eutectic alloy is introduced into the recess and the eutectic alloy is thus attached to crystal blank 2, a vibration characteristic of crystal blank 2 is deteriorated.

On the other hand, as described above, in the structure that first conduction metal film 7b is provided to the center of each short side of frame wall layer 1b and electrically connected to sealing metal film 7a by end face metal film 7c at the center of each short side, eutectic alloy 11 does not electrically short with crystal holding terminals 4 and eutectic alloy 11 is suppressed from being introduced into the recess. As a result, it is possible to prevent the eutectic alloy from being attached to crystal blank 2.

However, in the surface-mount type crystal unit shown in FIGS. 1A to 1C and 2A to 2C, on the stack surface between bottom wall layer 1a and frame wall layer 1b, second conduction metal films 6b composed of tungsten, for example, are formed toward the corners from the centers of the respective short sides, so that the strength of container body 1 against mechanical impact is decreased. In other words, since the bonding strength between a metal film and ceramic is lower than that between ceramics, the bonding strength between bottom wall layer 1a and frame wall layer 1b is decreased due to the provision of second conduction metal films 6b on the stack surface between bottom wall layer 1a and frame wall layer 1b, compared to a case where metal films 6b are not present. According to the experiment performed by the inventors, it was proven that strength against a horizontal impact to container body 1 is decreased, rather than a vertical impact to the container body. When the horizontal impact is applied, there is generated delamination at a boundary surface between bottom wall layer 1a and frame wall layer 1b.

A crystal unit capable of grounding a metal cover without a conduction metal film formed on a stack surface between a bottom wall layer and a frame wall layer is disclosed in a Japanese Patent Laid-Open Application No. 2004-146956 (JP-2004-146956A). In this crystal unit, via-holes are provided to the frame wall layer and the bottom wall layer, thereby electrically connecting the metal cover to a grounding external terminal. However, according to this structure, since the via-hole is formed, it is required to extend a frame width of the frame wall layer as much as the hole, so that a miniaturization of the crystal unit is hindered. In addition, the manufacturing processes are increased, so that manufacturing costs are increased.

DISCLOSURE OF THE INVENTION

Problems to be Solved by the Invention

As described above, in the surface-mount type crystal unit that grounds the metal cover while achieving miniaturization, when the electrically conducting path for grounding the metal cover is formed on the stack surface between the bottom wall layer and the frame wall layer, the strength of the container body against the impact is decreased. On the other hand, when the via-hole is formed, the miniaturization is hindered and the manufacturing process becomes complicated.

An object of the present invention is to provide a surface-mount type crystal unit in which the strength of a container body against impact is maintained without forming a via-hole and the like.

Means to Solve the Problems

The above object is achieved by a surface-mount type crystal unit comprising: a container body composed of laminated ceramics comprising a bottom wall layer of an approximately rectangular shape and a frame wall layer having an opening at a center thereof and provided on the bottom wall layer, the container body having a recess formed by the opening of the frame wall layer and having a planar projection shape of an approximate rectangle; a metal cover bonded to an upper surface of the frame wall layer surrounding the recess by a eutectic alloy; a pair of crystal connecting terminals that are formed at a location to be on one end portion side of the container body, the location being on an upper surface of the bottom wall layer while on an inner bottom surface of the recess; a crystal blank that is received in the recess by electrically connecting to the pair of crystal connecting terminals and is hermetically encapsulated in the recess by the metal cover; a pair of external terminals for crystal that are provided to two corners of four corners of an outer bottom surface of the container body and are electrically connected to the crystal connecting terminals, respectively; and a grounding external terminal that is formed at a corner of the outer bottom surface on the other end portion side of the container body, wherein a first conduction metal film is formed at the corner of a position corresponding to the grounding external terminal on a stack surface of the frame wall layer with the bottom wall layer, the first conduction metal film being electrically connected to the sealing metal film through an end face metal film formed on an inner side surface of the frame wall layer at the corner of the position corresponding to the grounding external terminal, wherein a second conduction metal film is formed at the corner of the position corresponding to the grounding external terminal on a stack surface of the bottom wall layer with the frame wall layer, the second conduction metal film being electrically connected to the grounding external terminal through an end face metal film formed on an outer side surface of the container body, and wherein the bottom wall layer and the frame wall layer are stacked, so that the first conduction metal film and the second conduction metal film are bonded to each other.

With the above structure, the first and second conduction metal films for connecting the metal cover to the grounding external terminal are provided at one corner only on the stack surface between the bottom wall layer and the frame wall layer. Hence, an area in which the bottom wall layer and the frame wall layer are directly bonded is increased, so that it is possible to enhance the bonding strength between the bottom wall layer and the frame wall layer. In addition, since the first and second conduction metal films are formed at the other end portion side of the container body, i.e., at the end far from the positions where the crystal holding terminals are formed, even when the eutectic alloy is introduced in the recess through the end face metal film connecting the first and second conduction metal films, it is possible to prevent an electric short between the eutectic alloy and the crystal holding terminals.

In the invention, the pair of external terminals for crystal are provided to a pair of diagonal corners of the outer bottom surface, respectively, and the grounding external terminal is provided to one corner of two corners of the outer bottom surface at positions of the other end portion side, which corner is not provided with the external terminals for crystal, so that it is possible to make an external terminal arrangement same as the conventional crystal unit. Hence, it is possible to secure a compatibility with the conventional crystal unit.

EXPLANATION OF REFERENCE NUMERALS

Figure 1A:
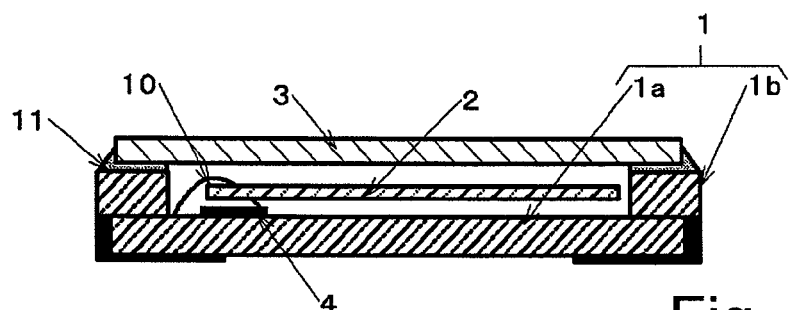
FIG. 1A is a sectional view showing an example of a conventional surface-mount type crystal unit.
Figure 1B:
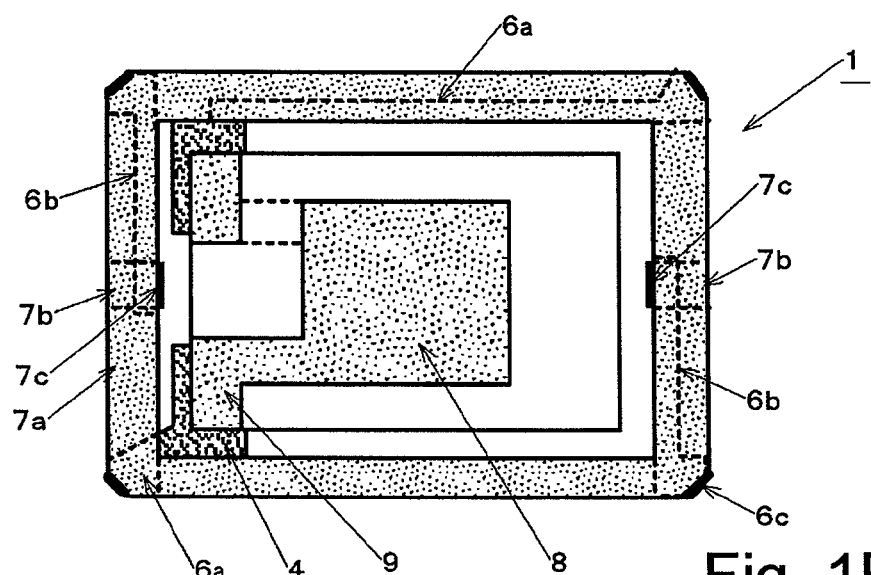
FIG. 1B is a plan view showing a state of the crystal unit shown in FIG. 1A in which a metal cover is removed.
Figure 1C:
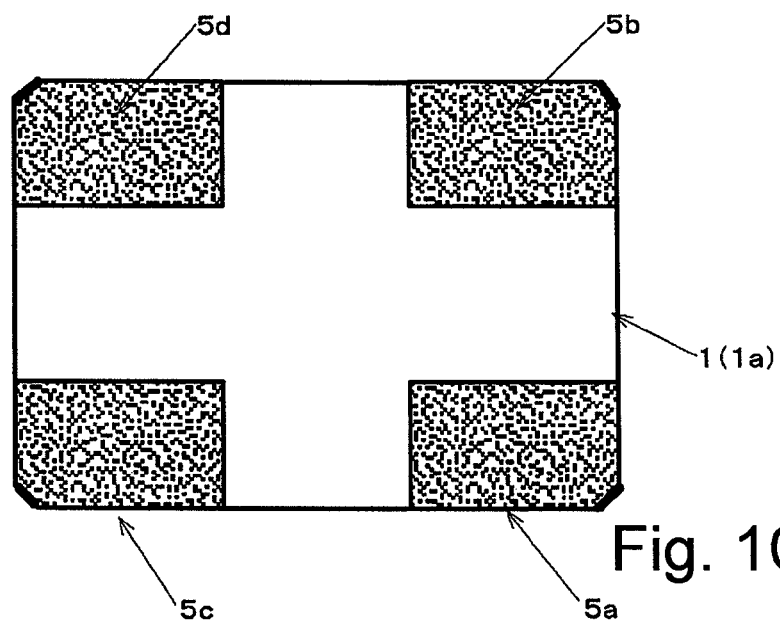
FIG. 1C is a plan view showing an outer bottom surface of crystal unit shown in FIG. 1A.
Figure 2A:
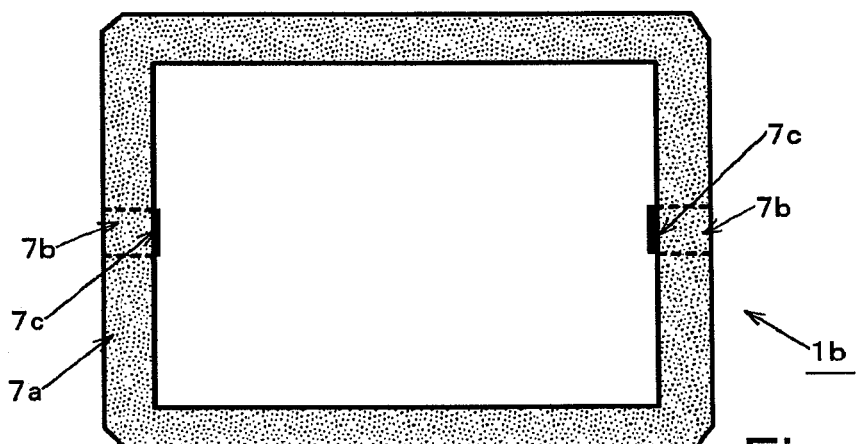
FIG. 2A is a plan view showing an opening end surface (i.e., upper surface) of a frame wall layer in the crystal unit shown in FIG. 1A.
Figure 2B:
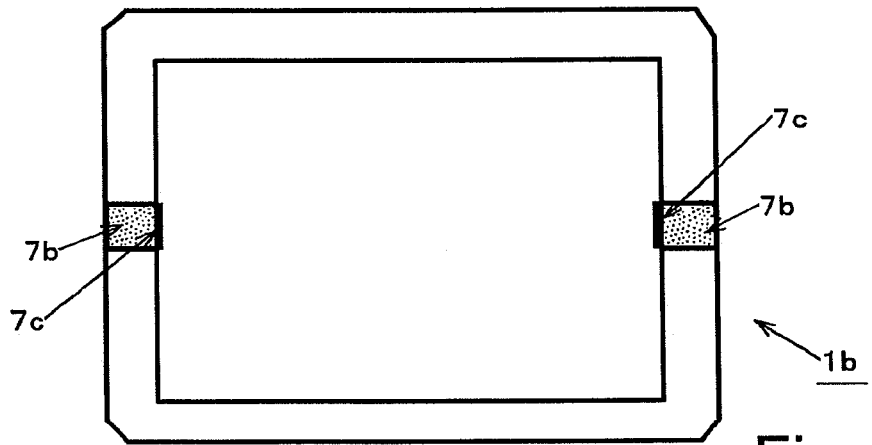
FIG. 2B is a bottom view showing a stack surface (i.e., lower surface) of the frame wall layer with a bottom wall layer in the crystal unit shown in FIG. 1A.
Figure 2C:
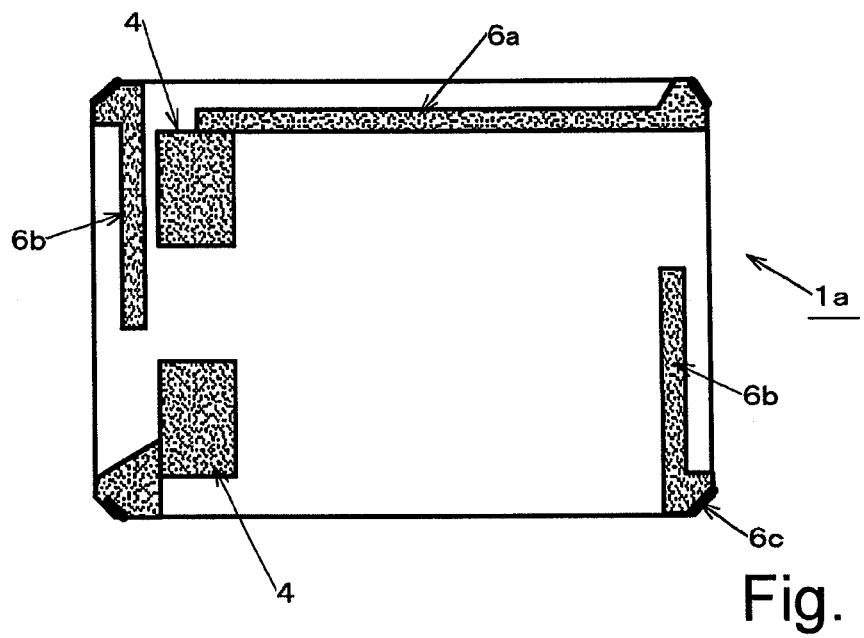
FIG. 2C is a plan view showing a stack surface of the bottom wall layer with the frame wall layer in the crystal unit shown in FIG. 1A.

1: container body, 1a: bottom wall layer, 1b: frame wall layer, 2: crystal blank, 3: metal cover, 4: crystal holding terminal, 5a to 5e: external terminals, 6a: electrically conducting path, 6b: second conduction metal film, 6c, 7c: end face metal films, 7a: sealing metal film; 7b: first conduction metal film, 8: excitation electrode, 9: extraction electrode, 10: conductive adhesive, 11: eutectic alloy.

DESCRIPTION OF THE EMBODIMENTS

A surface-mount type crystal unit according to an embodiment of the present invention is shown in FIGS. 3A to 3C and 4A to 4C. In these figures, the constitutional elements same as those shown in FIGS. 1A to 1C and 2A to 2C are denoted as the same reference numerals and the redundant descriptions thereof will be simplified or omitted.

The surface-mount type crystal unit according to this embodiment, similar to the crystal unit shown in FIGS. 1A to 1C and 2A to 2C, uses container body 1 having a recess formed in one peripheral surface, wherein crystal blank 2 is received in the recess and metal cover 3 is used to hermetically encapsulate crystal blank 2 in the recess. Container body 1 is made of laminated ceramics having: bottom wall layer 1a of an approximately rectangular shape; and frame wall layer 3b stacked on bottom wall layer 1a and having a rectangular opening at a center thereof. The container body has an outer shape of an approximately flat rectangular parallelepiped that seems a rectangle having a short side and a long side, seen from the top when mounted on a wiring board. Crystal blank 2 as described above is used.

Figure 4A:
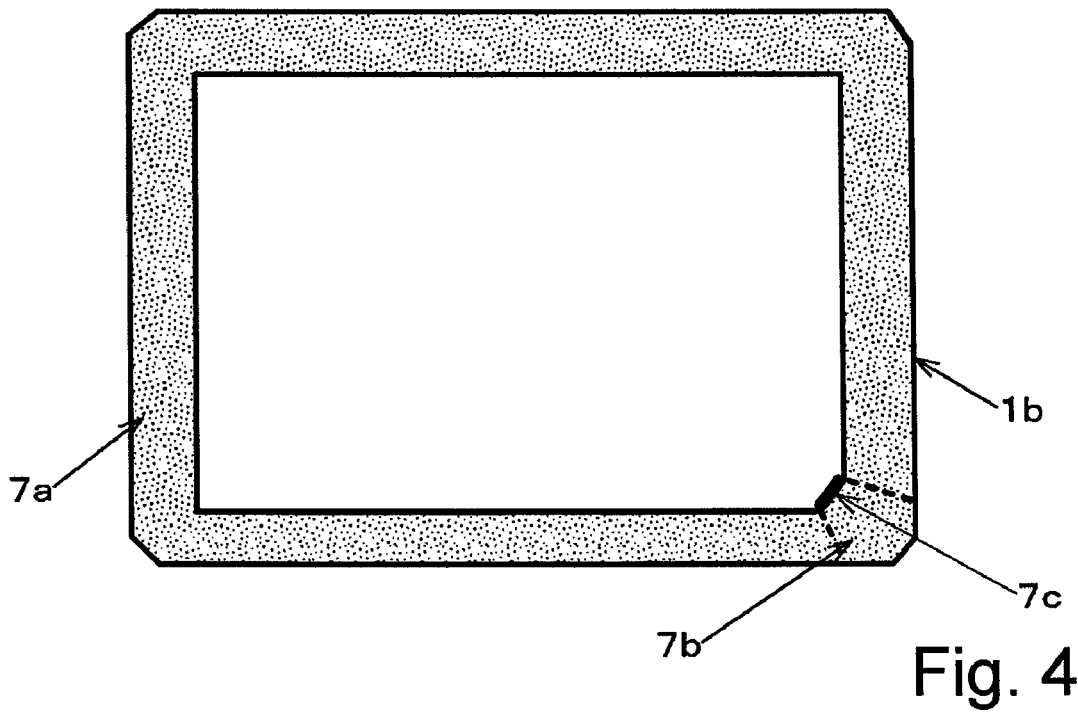
FIG. 4A is a plan view showing an opening end surface (i.e., upper surface) of a frame wall layer in the crystal unit shown in FIG. 3A.

A pair of diagonal corners of container body 1 are provided with external terminals 5a, 5e that are electrically connected to crystal holding terminals 4, which are provided at an inner bottom surface of the recess as described above, as shown in FIG. 3C. The other diagonal corners are provided with grounding external terminal 5c and dummy external terminal 5b. Dummy external terminal 5b is positioned at one of a pair of corners among four corners of the outer bottom surface, which pair of corners are at the end portion near to crystal holding terminals 4 in the recess. Grounding external terminal 5c is positioned at one of a pair of corners that are at the end portion far from the crystal holding terminals. An opening end surface of container body 1, i.e., an entire surface of a surface that surrounds the recess as an upper surface of frame wall layer 1b is formed with sealing metal film 7a to which metal cover 3 is bonded by eutectic alloy 11, as shown in FIG. 4A.

Figure 4B:
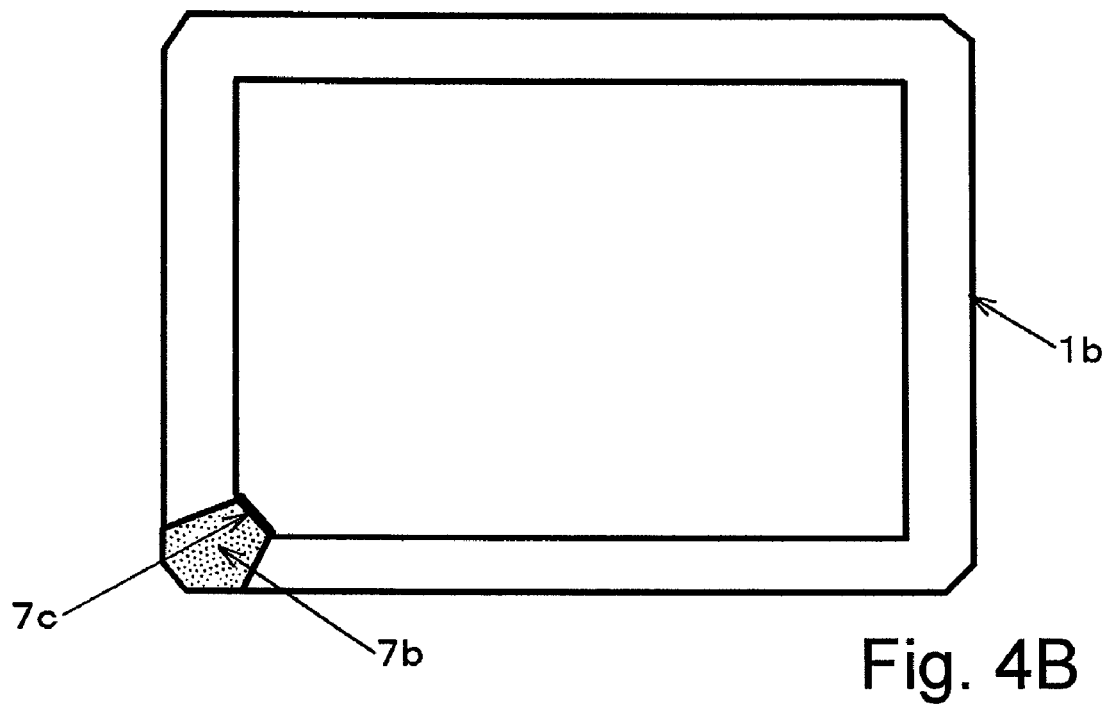
FIG. 4B is a bottom view showing a stack surface (i.e., lower surface) of the frame wall layer with a bottom wall layer in the crystal unit shown in FIG. 3A.
Figure 4C:
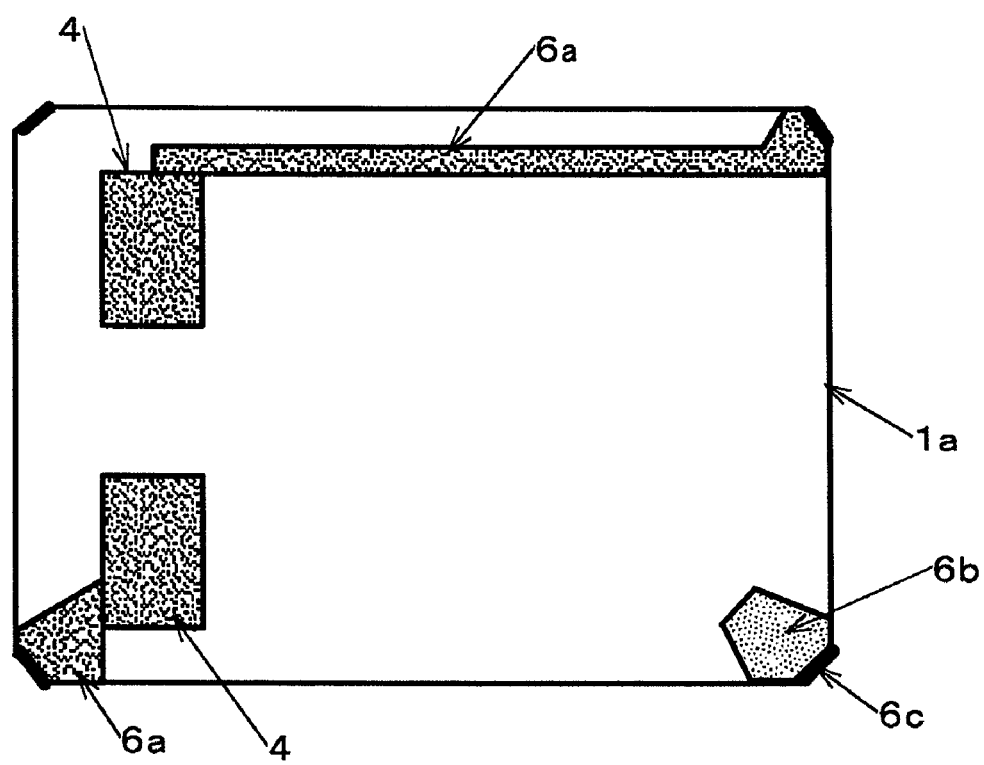
FIG. 4C is a plan view showing a stack surface of the bottom wall layer with the frame wall layer in the crystal unit shown in FIG. 3A.

On frame wall layer 1b of the crystal unit of this embodiment, first conduction metal film 7b, which is formed on a surface that is a stack surface with bottom wall layer 1a, is formed at the corner only at which grounding external terminal 5c is formed, as shown in FIG. 4B. At the position of this corner, the first conduction metal film is electrically connected to sealing metal film 7a of the opening end surface through end face metal film 7c formed on an inner side surface of frame wall layer 1b. On bottom wall layer 1a, second conduction metal film 6b, which is formed on a surface that is a stack surface with frame wall layer 1b, is formed at the corner only at which grounding external terminal 5c is formed, as shown in FIG. 4C. The second conduction metal film is electrically connected to grounding external terminal 5c through end face metal film 6c formed on an outer side surface of container body 1. Accordingly, at the corner at which grounding external terminal 5c is formed, second conduction metal film 6b of bottom wall layer 1a and first conduction metal film 7b of frame wall layer 1b are electrically connected to each other with being opposite to each other, and metal cover 3 is electrically connected to grounding external terminal 5c. Since container body 1 is formed by stacking and firing a ceramic sheet corresponding to bottom wall layer 1a and another ceramic sheet corresponding to frame wall layer 1b, first conduction metal film 7b and second conduction metal film 7a are actually integrated in container body 1 after the firing.

A planar outward size of container body 1 is, for example, 2.0 mm×1.6 mm, as the prior art, and a frame width W of frame wall layer 1b is 0.2 mm. A planar outward size of metal cover 3 is 1.9 mm×1.5 mm in this embodiment, which is smaller than that of the prior art shown in FIG. 1A, i.e., about 1.95 mm×1.55 mm. Thereby, a gap d between an outer edge of metal cover 3 and an outer edge of frame wall layer 1b is 0.05 mm and ratio d/W is about 0.25.

With the above structure, on the stack surface between bottom wall layer 1a and frame wall layer 1b, first and second conduction metal films 7b, 6b provided so as to ground metal cover 3 are present at only one corner of among the four corners of the stack surface, which corresponds to the position of grounding external terminal 5c. Except the forming position of electrically conducting film 6a for extracting crystal connecting terminals 4, on the stack surface between bottom wall layer 1a and frame wall layer 1b, metal films 6b, 7b are present at only the corner at which grounding external terminal 5c is formed, and bottom wall layer 1a and frame wall layer 1b both made of ceramics are directly bonded in the remaining areas. Hence, in the crystal unit of this embodiment, a bonding strength of bottom wall layer 1a and frame wall layer 1b is higher than that of the conventional crystal unit.

In the above arrangement, since first and second conductive metal films 6b, 7b are formed at the end portion opposite to the end portion at which crystal holding terminals 4 are formed, on the stack surface, end face metal film 7c that connects first and second conduction metal films 6b, 7b and sealing metal film 7a is also formed at the end portion far from crystal holding terminals 4. Accordingly, even when eutectic alloy 11 is introduced in the recess beyond end surface metal film 7c upon bonding metal cover 3, it is possible to prevent an electrical short of the eutectic alloy with crystal holding terminals 4.

Further, in the crystal unit of this embodiment, the planar outward size of metal cover 3 is smaller than that of the prior art, and the above-described ratio of the gap d and the frame width W, i.e., d/W is set to 0.25. In other words, an overlapped area of the opening end surface of frame wall layer 1b, i.e., the upper surface, and metal cover 3 is reduced and an area that is not covered by metal cover 3 on the opening end surface is instead increased. As a result, when bonding metal cover 3 to the opening end surface by melting eutectic alloy 11, the molten excessive eutectic alloy 11 is easily escaped to the peripheral portions of the upper surface of frame wall layer 1b, and an amount of the eutectic alloy, which is transferred through end face metal film 7c and is introduced into the recess, is correspondingly reduced. As the amount of the eutectic alloy that may be introduced into the recess is reduced, it is possible to securely prevent the eutectic alloy from being attached to the other end portion of crystal blank 2.

Figure 3A:
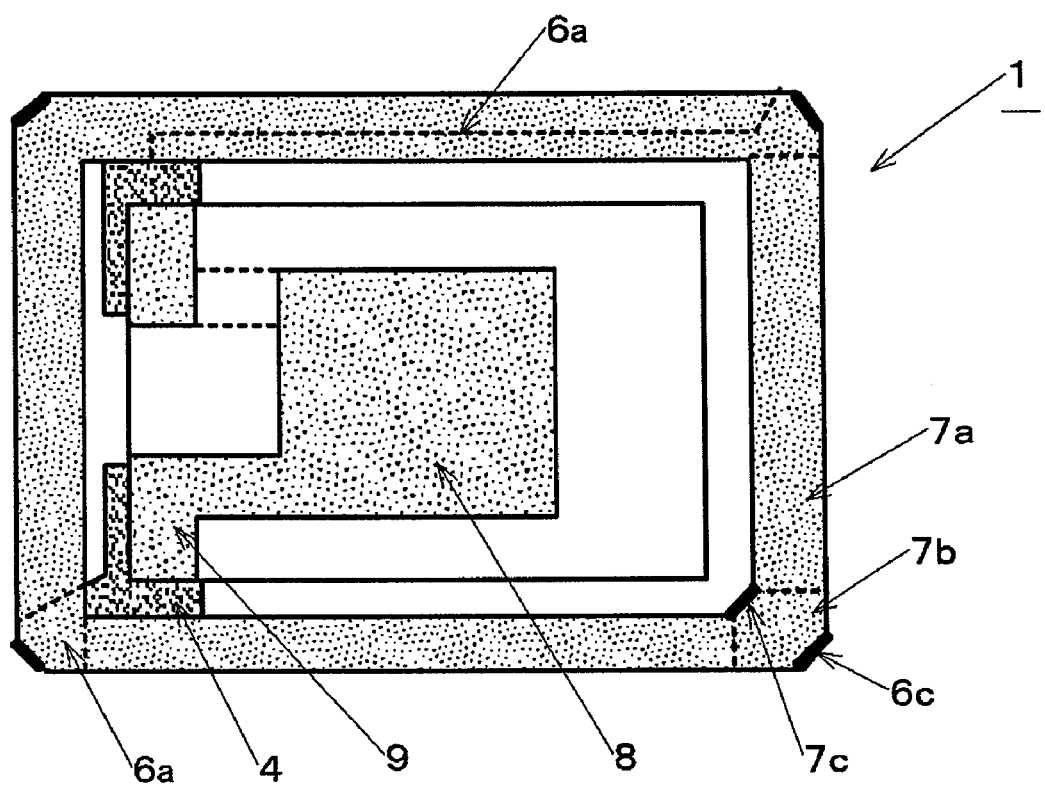
FIG. 3A is a plan view showing a surface-mount type crystal oscillator according to an embodiment of the invention, in which a metal cover is removed.
Figure 3B:
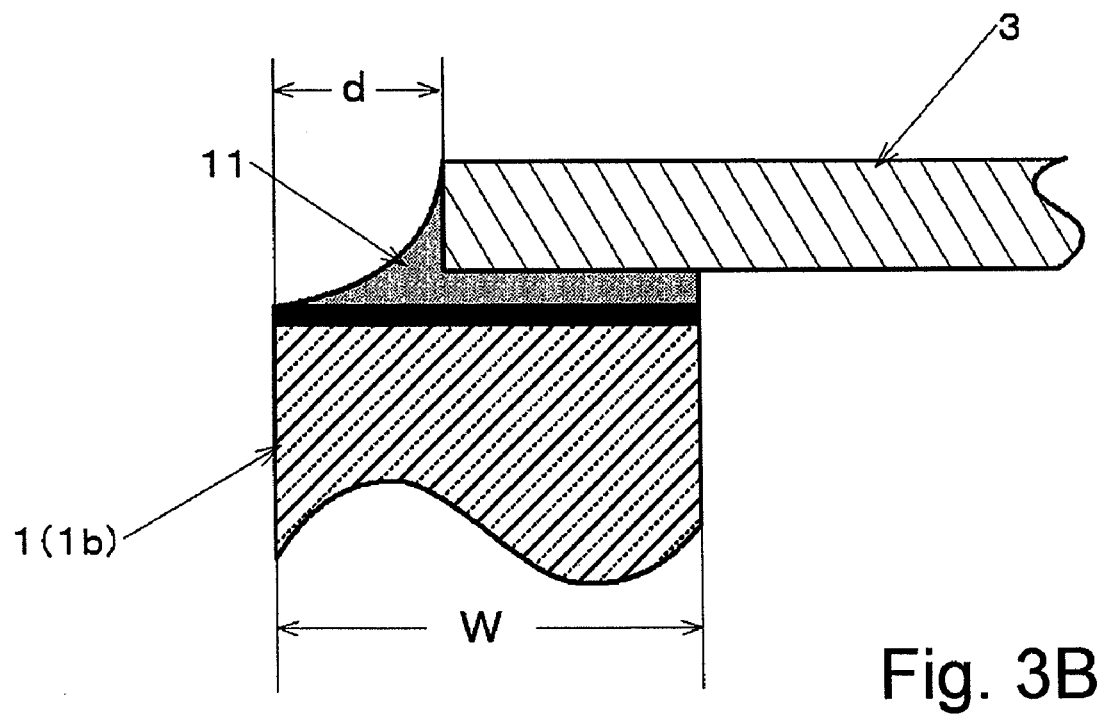
FIG. 3B is a partial enlarged sectional view of the crystal unit shown in FIG. 3A.
Figure 3C:
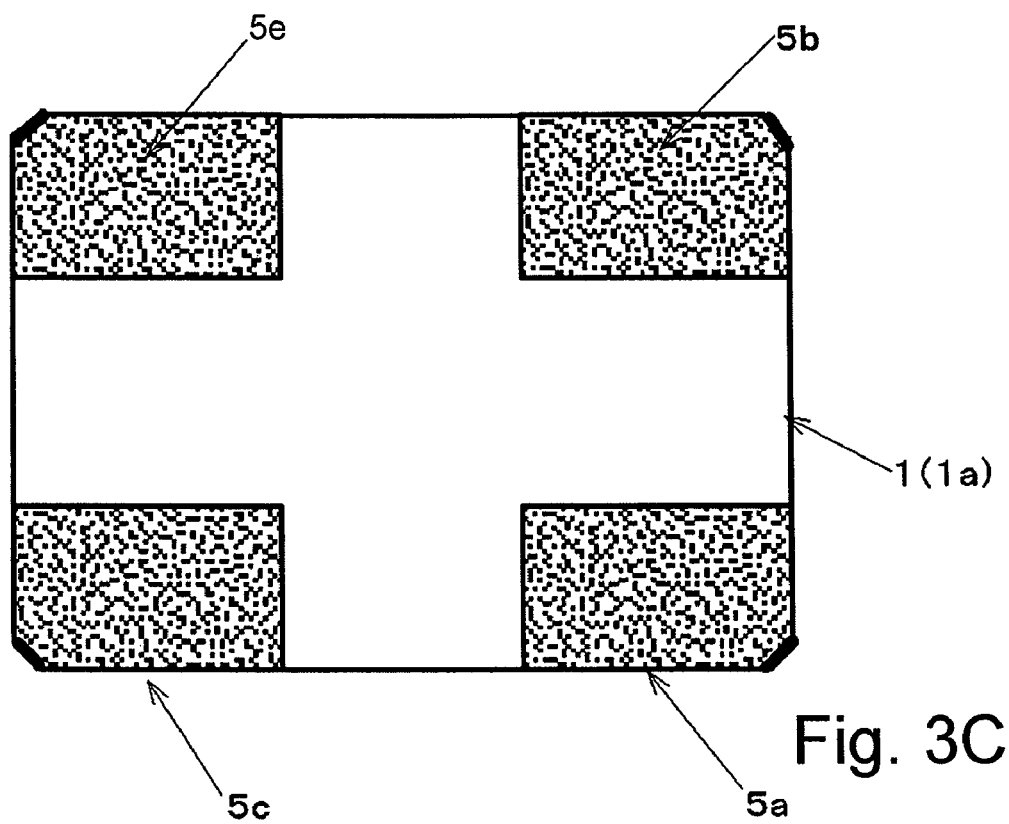
FIG. 3C is a plan view showing an outer bottom surface of the crystal unit shown in FIG. 3A.

Meanwhile, in this embodiment, the outward size of metal cover 3 is made to be smaller, so that the overlapped area of metal cover 3 and the upper surface of frame wall layer 1b is reduced. Under such state, a so-called seal path is also reduced, so that the hermetical sealing of the recess may not be maintained. However, as shown in FIG. 3B, the molten eutectic alloy ascends along the side surface of metal cover 3 and the eutectic alloy itself is spread out over the entire upper surface of frame wall layer 1b. Hence, a sufficient seal path is secured, so that the inside of the recess can be securely maintained in an air-tight manner.

The invention claimed is:

1. A surface-mount type crystal unit comprising:
   a container body comprising a bottom wall layer of an approximately rectangular shape and a frame wall layer having an opening at a center thereof and provided on the bottom wall layer, said container body having a recess formed by the opening of the frame wall layer and having a planar projection shape of an approximate rectangle;
   a sealing metal film formed on an upper surface of the frame wall layer surrounding the recess;
   a metal cover bonded to the sealing metal film by a eutectic alloy;
   a pair of crystal holding terminals that are formed at a location to be on an upper surface of the bottom wall layer while on an inner bottom surface of the recess, said location being on one end portion side of the container body;
   a crystal blank that is received in the recess by electrically connecting to the pair of crystal holding terminals and is hermetically encapsulated in the recess by the metal cover;
   a pair of external terminals for crystal that are provided to two corners of four corners of an outer bottom surface of the container body and are electrically connected to the crystal connecting terminals, respectively; and
   a grounding external terminal that is formed at a corner of the outer bottom surface on the other end portion side of the container body,
   wherein a first conduction metal film is formed at the corner of a position corresponding to the grounding external terminal on a stack surface of the frame wall layer with the bottom wall layer,
   wherein the first conduction metal film is electrically connected to the sealing metal film through an end face metal film formed on an inner side surface of the frame wall layer at the corner of the position corresponding to the grounding external terminal,
   wherein a second conduction metal film is formed at the corner of the position corresponding to the grounding external terminal on a stack surface of the bottom wall layer with the frame wall layer,
   wherein the second conduction metal film is electrically connected to the grounding external terminal through an end face metal film formed on an outer side surface of the container body, and
   wherein the bottom wall layer and the frame wall layer are stacked, so that the first conduction metal film and the second conduction metal film are bonded to each other.

2. The crystal unit according to claim 1, wherein the crystal blank includes excitation electrodes respectively formed on both principal surfaces of the crystal blank and extraction electrodes extended from the excitation electrodes to both sides of one end of the crystal blank, and both sides of the one end to which the extraction electrodes are extended are adhered to the pair of crystal holding terminals by a conductive adhesive.

3. The crystal unit according to claim 1, wherein the pair of external terminals for crystal are disposed on a pair of diagonal corners of the outer bottom surface, respectively, and the grounding external terminal is disposed on a corner of two corners of the outer bottom surface at positions of the other end portion side, which corner being not provided with the external terminal for crystal.

4. The crystal unit according to claim 3, wherein a corner of four corners of the outer bottom surface, to which neither the external terminals for crystal nor the grounding external terminal is provided, is provided with a dummy external terminal.

5. The crystal unit according to claim 1, wherein the container body is composed of laminated ceramics.

6. The crystal unit according to claim 2, wherein the pair of external terminals for crystal are disposed on a pair of diagonal corners of the outer bottom surface, respectively, and the grounding external terminal is disposed on a corner of two corners of the outer bottom surface at positions of the other end portion side, which corner being not provided with the external terminal for crystal.

7. The crystal unit according to claim 6, wherein a corner of four corners of the outer bottom surface, to which neither the external terminals for crystal nor the grounding external terminal is provided, is provided with a dummy external terminal.

8. The crystal unit according to claim 7, wherein the container body is composed of laminated ceramics.

* * * * *